(12) United States Patent
Montgomery et al.

(10) Patent No.: US 7,135,256 B2
(45) Date of Patent: *Nov. 14, 2006

(54) METHOD OF INCREASING THE SHELF LIFE OF A PHOTOMASK SUBSTRATE

(75) Inventors: Melvin Warren Montgomery, Camas, WA (US); Jeffrey A. Albelo, Hillsboro, OR (US); Zoilo Cheng Ho Tan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/651,549

(22) Filed: Aug. 29, 2003

(65) Prior Publication Data

US 2005/0191562 A1 Sep. 1, 2005

Related U.S. Application Data

(63) Continuation of application No. 09/990,684, filed on Nov. 21, 2001, now Pat. No. 6,727,047, which is a continuation-in-part of application No. 09/904,454, filed on Jul. 12, 2001, now abandoned, which is a continuation-in-part of application No. 09/293,713, filed on Apr. 16, 1999, now abandoned.

(51) Int. Cl.
*G03F 9/00* (2006.01)

(52) U.S. Cl. .................... 430/5; 430/296; 430/311; 430/330; 430/942; 430/945

(58) Field of Classification Search .................... 430/5, 430/330, 318, 296, 311, 942, 945
See application file for complete search history.

(56) References Cited

U.S. PATENT DOCUMENTS

| | | | |
|---|---|---|---|
| 5,260,349 A | 11/1993 | Crivello | 522/31 |
| 5,492,793 A | 2/1996 | Breyta et al. | 430/270.14 |
| 5,545,509 A | 8/1996 | Cameron et al. | 430/270.1 |
| 5,641,715 A | 6/1997 | Okamoto | 438/669 |
| 5,741,629 A | 4/1998 | Chandross et al. | 430/326 |
| 5,783,251 A | 7/1998 | Tomozawa et al. | 427/8 |
| 5,830,619 A | 11/1998 | Chin et al. | 430/270.1 |
| 5,837,423 A | 11/1998 | Okamoto | 430/296 |
| 5,863,705 A | 1/1999 | Sezi et al. | 430/311 |
| 5,866,304 A | 2/1999 | Nakano et al. | 430/325 |
| 5,985,519 A | 11/1999 | Kakamu et al. | 430/313 |
| 6,165,682 A | 12/2000 | Foster et al. | 430/270.1 |
| 6,180,316 B1 | 1/2001 | Kajita et al. | 430/270.1 |
| 6,258,514 B1 | 7/2001 | Montgomery | 430/315 |
| 6,297,067 B1 | 10/2001 | Hattori | 438/20 |
| 6,399,481 B1 | 6/2002 | Yamada | 438/636 |
| 6,582,861 B1 | 6/2003 | Buxbaum et al. | 430/5 |
| 6,605,394 B1 | 8/2003 | Montgomery et al. | 430/5 |
| 6,727,047 B1 * | 4/2004 | Montgomery et al. | 430/322 |
| 2004/0265706 A1 * | 12/2004 | Montgomery et al. | 430/5 |

FOREIGN PATENT DOCUMENTS

| | | |
|---|---|---|
| DE | 4040117 | 6/1992 |
| DE | 4117127 | 11/1992 |
| EP | 0364368 | 4/1990 |
| EP | 0488372 | 6/1992 |
| EP | 0540488 | 5/1993 |
| JP | 10-120968 | 8/1998 |
| WO | WO 03010601 | 2/2003 |

OTHER PUBLICATIONS

M. Angelopolous et al., "Conducting polyanilines: Discharge layers for electron-beam lithography", J. Vac. Sci. Technol. B, vol. 7, No. 6, pp. 1519-1523 (Nov/Dec 1989).
M. Angelopolous et al., "Lithographic applications of conducting polymers", J. Vac. Sci. Technol. B, vol. 9, No. 6, pp. 3428-3431 (Nov/Dec 1991).
P. Buck et al., "Performance of the ALTA 3500 scanned-laser mask lithography system", Proceedings of SPIE, vol. 3412, pp. 67-78 (Apr. 1998).
M. Cheng et al., "Process Characteristics of an all-organic chemically amplified deep-ultraviolet resist", J. Vac. Sci. Technol. B, vol. 9, No. 6, pp. 3374-3379 (Nov. 1991).
K. Kemp et al., "Effects of DUV Resist Sensitivities on Lithographic Process Window", Proceedings of SPIE, vol. 3049, pp. 955-962 (1997).

* cited by examiner

*Primary Examiner*—Christopher G. Young
(74) *Attorney, Agent, or Firm*—Shirley L. Church

(57) ABSTRACT

In photomask making, the environmental sensitivity of a chemically amplified photoresist is eliminated, or at least substantially reduced, by overcoating the photoresist with a thin coating (topcoat) of a protective but transmissive material. To provide improved stability during the long time period required for direct writing of a photomask pattern, typically in the range of about 20 hours, the protective topcoat material is pH adjusted to be as neutral in pH as possible, depending on other process variable requirements. For example, a pH adjusted to be in the range from about 5 to about 8 is particularly helpful. Not only is the stability of the chemically amplified photoresist better during direct writing when the protective topcoat is pH adjusted, but a photoresist-coated substrate with pH adjusted topcoat over its surface can be stored longer prior to imaging without adverse consequences.

33 Claims, 4 Drawing Sheets

METHOD OF INCREASING THE SHELF LIFE OF A PHOTOMASK SUBSTRATE

CROSS REFERENCE TO RELATED APPLICATIONS

This application is a continuation application of application Ser. No. 09/990,684, filed Nov. 21, 2001 now U.S. Pat. No. 6,727,047, which is currently pending; which is a continuation-in-part of application Ser. No. 09/904,454, filed Jul. 12, 2001, which is abandoned; which is a continuation-in-part of application Ser. No. 09/293,713, which is abandoned.

BACKGROUND OF THE INVENTION

1. Field of the Invention

In general, the present invention relates to a method of fabrication of photomasks, sometimes referred to as reticles. In particular, the photomasks are fabricated using a direct write process which employs exposure of a chemically amplified photoresist to laser-produced Deep Ultra Violet (DUV) radiation or to electron beam radiation.

2. Brief Description of the Background Art

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate rather than by direct write on the semiconductor substrate, because of the time economy which can be achieved by blanket processing through a patterned masking layer. With regard to semiconductor device processing, the patterned masking layer may be a patterned photoresist layer or may be a patterned "hard" masking layer (typically an inorganic material or a high temperature organic material) which resides on the surface of the semiconductor device structure to be patterned. The patterned masking layer is typically created using another mask which is frequently referred to as a photomask or reticle. A reticle is typically a thin layer of a metal-containing material (such as a chrome-containing, molybdenum-containing, or tungsten-containing material, for example) deposited on a glass or quartz plate. The reticle is patterned to contain a "hard copy" of the individual device structure pattern to be recreated on the masking layer overlying a semiconductor structure.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying photoresist, where the reticle is exposed to blanket radiation which passes through open areas of the reticle onto the surface of the photoresist. The photoresist is then developed and used to transfer the pattern to an underlying semiconductor device structure. Due to present day pattern dimensional requirements, which are commonly less than 0.3 µm, the photoresist is typically a chemically amplified photoresist. In the making of the reticle itself, a chemically amplified DUV photoresist has been used in combination with a laser-produced DUV radiation or a direct write electron beam writing tool. An example of a continuous wave laser-produced DUV direct write tool is available under the trade name ALTA™ from ETEC Systems, Inc., Hillsboro, Oreg. An example of an electron beam direct writing tool is available under the trade name MEBES™ from ETEC Systems, Inc., Hayward, Calif.

Preparation of a photomask/reticle is a complicated process involving a number of interrelated steps which affect the critical dimensions of a pattern produced in the reticle, including the uniformity of the pattern critical dimensions across the surface area of the reticle. By changing various steps in the reticle manufacturing process, the reproducibility of the manufacturing process itself may be altered, including the processing window. Processing window refers to the amount process conditions can be varied without having a detrimental outcome on the product produced. The larger the processing window, the greater change permitted in processing conditions without a detrimental affect on the product. Thus, a larger process window is desirable, as this generally results in a higher yield of in specification product produced.

One processing variable which has significantly reduced the processing window for photomask fabrication is the shelf life of a reticle substrate with the photoresist applied over its surface. As previously mentioned, the photoresist used for pattern imaging of 0.3 µm or less feature sizes is typically a chemically amplified photoresist. The chemically amplified photoresist (CAR) is generally designed to produce an acid in the area irradiated by ultraviolet light, laser light, X rays or an electron beam. The irradiated area forms an image in the CAR which is subsequently developed into a pattern. The acid produced renders the irradiated portion of the CAR soluble in a basic developing solution. Many variations of chemically amplified resists are commercially available primarily for 257 nm, 248 nm, and 193 nm deep ultraviolet (DUV) light lithography application. Many of these CARs have been used in electron beam light lithography.

It is generally known that photoresists, and especially CAR, are sensitive to certain environmental contaminants, thus rendering their use for mask fabrication somewhat problematic, often requiring special handling. It has been found that CAR deteriorates in terms of lithographic performance as soon as one hour (or less) after its application over a substrate. To prevent this, applicants developed a protective coating for application over the CAR, as a means of extending the time a photomask substrate with CAR applied could be stored prior to exposure to the imaging/patterning radiation. However, subsequent to development of the protective coating, we discovered that reproducibility of patterning during the direct write imaging processing was not good. A direct write process for a photomask may take up to about 20 hours, and during the 20 hour time period, the photoresist was being affected in a manner so that the critical dimension of the patterned feature was becoming smaller as the direct writing on the photoresist progressed. The present invention solves the problem of how to maintain a uniform and reproducible pattern critical dimension in the CAR during the direct writing process for imaging a photomask.

SUMMARY OF THE INVENTION

In photomask making, the environmental sensitivity of a chemically amplified photoresist is eliminated, or at least substantially reduced, by overcoating the photoresist with a thin coating (topcoat) of a protective but transmissive material. It is particularly helpful if the topcoat material exhibits a refractive index and thickness which is matched to the refractive index and thickness of the photoresist. The representative equation is: $t=\lambda/4n$, where $t$=thickness, $\lambda$=wavelength of light passing through the topcoat or photoresist, and $n$=refractive index. For Deep UV direct write imaging, typically the chemically amplified photoresist thickness is in the range of about 5000 Å, and the refractive index varies from about 1.79 to about 1.83. As a result, the thickness of the topcoat is typically ranges from about 650 Å to about 675 Å, and the refractive index of the topcoat ranges from about 1.32 to about 1.45. In general, the refractive index of the topcoat=the square root of the refractive index of the chemically amplified photoresist.

To provide improved stability during the long time period required for direct writing of a photomask pattern, typically in the range of about 20 hours, the topcoat is pH adjusted to be as neutral in pH as possible, depending on other process variable requirements. Although a topcoat pH of about 6.5 to about 7.5 may be used in some instances, a pH ranging from about 5 to about 8 may generally be used, and is often necessary when the topcoat is to be charge dissipating (such as for e-beam lithography, where the topcoat is rendered conductive). The conductivity of the topcoat may assist in maintaining the shelf life of the underlying photoresist in general, during storage in handling which may be for time periods up to weeks. In addition, the conductivity assists in providing stability of the photoresist during the direct write process. By adjusting the pH of the topcoat to fall within a range of about 5 to about 8, both the storage life of a photoresist-coated substrate is increased, and the stability during direct write imaging of the photoresist by either optical or e-beam radiation is significantly improved, providing substantial improvement in lithographic performance (in terms of critical dimension and integrity) of the photoresist.

There are instances where the direct writing upon the photoresist is conducted using a tool which is optical in nature. An example would be a direct write continuous wave laser which produces DUV radiation. In this instance, a more neutral topcoat having a pH in the range of about 6.5 to 7.5 may be used. For example, U.S. patent application Ser. No. 09/848,859, filed May 3, 2001, titled: "Organic Bottom Antireflective Coating For High Performance Mask Making Using Optical Imaging", and assigned to the assignee of the present invention, describes a reticle fabrication process which employs a new direct pattern writing tool which is a 244 nm or a 257 nm mask writing laser available from ETEC Systems Inc., Hillsboro, Oreg. Additional information about process variables in the 257 nm direct writing of photomask patterns is provided in U.S. application Ser. No. 09/912,116, filed Jul. 23, 2001, titled: "Method Of Preparing Optically Imaged High Performance Photomasks", also assigned to the assignee of the present invention. Both of these applications are hereby incorporated by reference in the present application, in their entirety.

By application of a pH adjusted protective topcoat, described above, over a CAR, it is possible to prepare an unexposed photoresist-coated substrate (wafer or reticle) months before its actual exposure, and to maintain the substrate in a patterning (imaging) tool for long time periods. This is in contrast with the use of an unprotected CAR which requires application of the photoresist to the substrate immediately prior to the pattern writing, and which does not provide as consistent a critical dimension during the entire photomask direct writing process.

In accordance with another embodiment of the invention, the environmental sensitivity of the photoresist is eliminated, or at least substantially reduced, by overcoating a chemically amplified (or other) resist with a thin coating of a protective but transmissive material. This allows long term storage (e.g., up to four months or longer) of a photomask substrate to which photorseist has been applied prior to imaging/patterning of the substrate.

A protective coating extends the stability of lithographic performance of the photoresist and thereby extends the shelf life of the photoresist-coated substrate, e.g., for a day, a week, a month, or months (at least four months as determined by experiment) after its application. Shelf life is not limited to mere storage, but includes, e.g., time spent in transit. This is a substantial improvement, since normally CAR formulations are subject to undesirable performance changes within minutes of application. Thus, such an unexposed coated substrate (wafer or reticle) becomes an article of manufacture and of commerce, rather than merely a transitory result of a process. This opens up a new business manufacturing opportunity (inter- or intracompany) in such articles of manufacture not available previously, since this means that one company (or location) can manufacture photoresist coated reticle blanks, for example, and another company (or location) can then later perform the pattern imaging (exposure), in contrast to present practice.

Any suitable material which may be effective as a diffusion barrier (i.e., which may prevent diffusion of contaminants) may be employed as the protective overcoat. For example, in deep UV direct write laser mask fabrication, a material sold under the trade name AZ Aquatar III, by Clariant Corporation, may be employed to coat an entire mask substrate after application of the photoresist and prior to exposure to imaging radiation.

BRIEF DESCRIPTION OF THE DRAWINGS

A better understanding of the invention is obtained when the following detailed description is considered in conjunction with the following drawings in which:

FIG. 2A shows a schematic cross-sectional view of the starting structure 230 of the kind shown in FIG. 1, with direct write actinic radiation being applied.

FIG. 2B shows the schematic cross-sectional view of the structure 230 shown in FIG. 2A subsequent to direct writing (imaging) 223, and during post exposure bake.

FIG. 2C shows the schematic cross-sectional view of the structure 230 shown in FIG. 2B, subsequent to removal of a protective topcoat layer 222.

FIG. 2D shows the schematic cross-sectional view of the structure 230 shown in FIG. 2C, after development of the CAR 216.

FIG. 2E shows the schematic cross-sectional view of the structure 230 shown in FIG. 2D, after transfer of the pattern from CAR 216 into chromium-comprising layer 214.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

This application is a continuation-in-part of application Ser. No. 09/904,454, filed Jul. 12, 2001, presently pending, which is a continuation-in-part application of Ser. No. 09/293,713, filed Apr. 16, 1999, also presently pending. The subject matter of these two applications is hereby incorporated by reference, each in its entirety.

Figure 1:
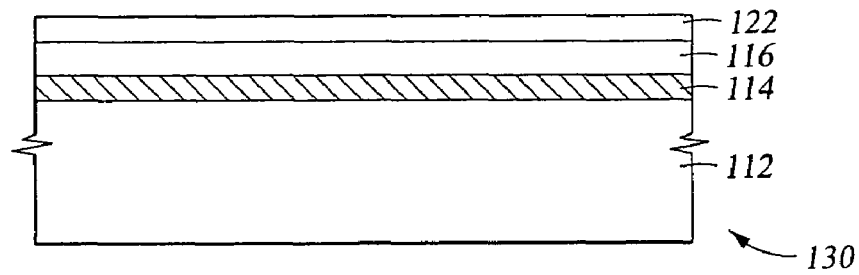
FIG. 1 shows a photomask blank including a substrate 112 with overlying chromium layer 114, a layer of CAR 116 overlying chromium layer 114, and a protective topcoat 122 overlying CAR 116.

FIG. 1 shows a schematic of a cross-sectional view of a structure 130 which may be used to illustrate one embodiment of the present invention. The structure 130 includes, from bottom to top, a substrate 112, which, in the case of a photomask, is typically selected from quartz, fluorinated quartz, borosilicate glass, or soda lime glass; a chrome-containing layer 114; a DUV photoresist layer (a CAR) 116; and, a protective topcoat 122. This structure is somewhat simplified, since most photomask substrates prior to patterning include antireflective coatings (ARCs). An ARC may be present between chrome-containing layer 114 and CAR photoresist layer 116, and may also be present between photoresist layer 116 and protective topcoat 122. For purposes of simplification, such ARCs are not shown in the Figures. With respect to the use of an ARC between photoresist layer 116 and topcoat 122, the protective topcoat 122 itself may be an ARC. In applicants' embodiments, the topcoat 122 is an ARC, since this is the most efficient structure.

If there is an ARC present between chrome-containing layer 114 and CAR photoresist layer 116, this ARC is typically referred to as a Bottom ARC, or a BARC. Such a BARC is typically an inorganic ARC such as chrome oxynitride, titanium nitride, silicon nitride, or molybdenum silicide 206. There may be an additional organic ARC overlying the inorganic ARC, as described in U.S. application Ser. No. 09/848,859, filed May 3, 2001, titled: "Organic Bottom Antireflective Coating For High Performance Mask Making Using Optical Imaging", also assigned to the assignee of the present invention, and previously incorporated by reference. In the alternative, the BARC may be an organic ARC of the kind described in U.S. application Ser. No. 09/848,589, used alone, in the absence of an inorganic BARC. Although the presence of a BARC affects the critical dimension of the pattern features eventually produced in the chrome-containing layer, the present invention pertains to other process factors which affect the critical dimension of pattern features, so the BARC is not discussed in detail herein. One skilled in the art, after reading this disclosure, will understand that the principal embodiment of the present invention pertains to the topcoat 122 and its contribution to obtaining a repeatable photomask pattern having the desired pattern features, with uniform critical dimension of pattern features across the entire photomask.

It is highly desirable to have a photomask which provides features having critical dimensions of 0.3 µm or less, where the uniformity of the critical dimensions is maintained across the entire surface of the photomask. To accomplish this, it is necessary to have a method of producing a patterned photoresist which is imaged and developed uniformly across the photomask surface. The developed pattern profile of the photoresist needs to exhibit minimal surface distortions, including "t"-topping", which occurs at the top of the photoresist when the photoresist is exposed to ambient conditions which neutralize the acidic content of the photoresist material at the upper surface of the photoresist. FIGS. 2A through 2E illustrate a series of process steps which are instructive in understanding the present invention.

Figure 2A:
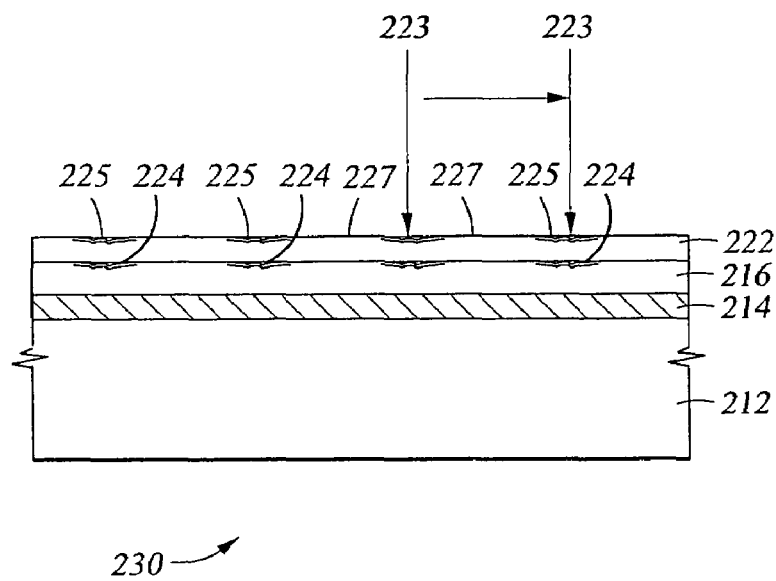
FIGS. 2A–2E are a conceptual process flow diagram of a method in accordance with an embodiment of the present invention, where a starting structure of the type shown in FIG. 1 is patterned using a direct write process.

In particular, FIG. 2A shows a structure 230 including from bottom to top, a layer of fused silica 212, a chrome-containing layer 214, a CAR 216, and a protective topcoat 222. Structure 230 is exposed to actinic radiation 223 in a direct write process which produces an image 224 in CAR 216, with the actinic radiation traveling through protective topcoat 222 to reach CAR 216. As described in Examples below, applicants used an optical imaging system which direct writes a pattern at 244 or 257 nm to image a Deep UV CAR photoresist. As previously mentioned, it is important that the refractive index of protective topcoat 222 be "matched" with the refractive index of CAR 216; and, typically, the refractive index of protective topcoat layer 222 is approximately equal to the square root of the refractive index of the chemically amplified photoresist layer 216.

Figure 2B:
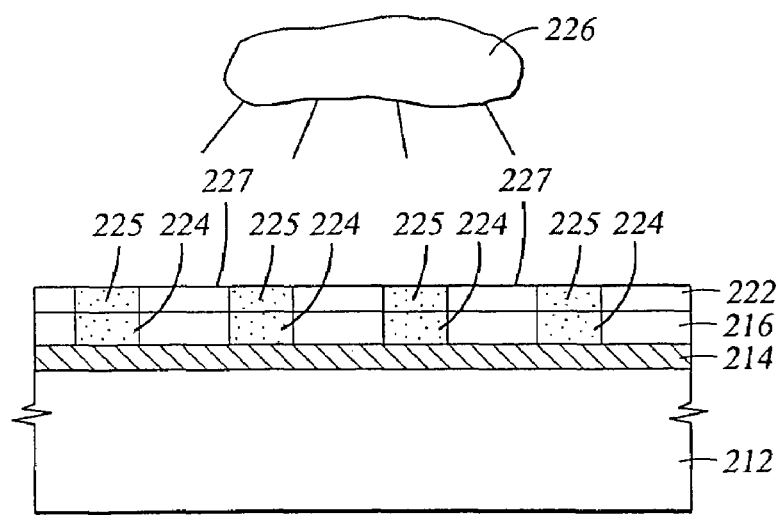

As illustrated in FIG. 2B, after imaging of the CAR 216, the structure 230 is "baked" at a temperature within a specifically designed range under ambient conditions, to help promote the full chemical reaction within the CAR so that the image 224 will be transferred throughout the entire thickness of the CAR 216 and the pattern can subsequently be properly developed. The bake step shown in FIG. 2B is frequently referred to as Post Exposure Bake, or PEB. In FIG. 2B, a source of heat 226 is applied to CAR 216 to fully promote the image within the CAR 216.

Figure 2C:
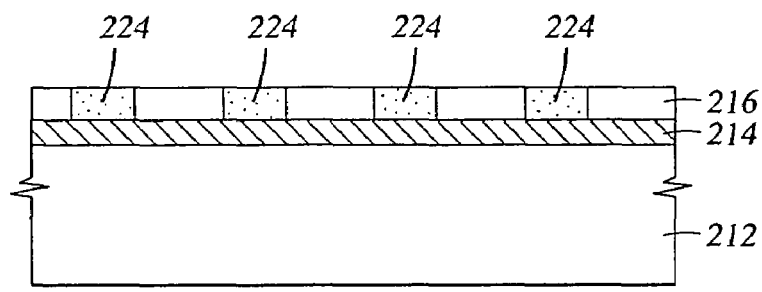

Subsequent to the bake step shown in FIG. 2B, an optional step, shown in FIG. 2C, may be used to remove topcoat 222. This step may not be necessary if the treatment used to develop the CAR photoresist 216 also removes topcoat 222. In the present embodiments, a deionized water rinse was used to remove topcoat 222 prior to development of the CAR photoresist 216, as shown in FIG. 2C.

Figure 2D:
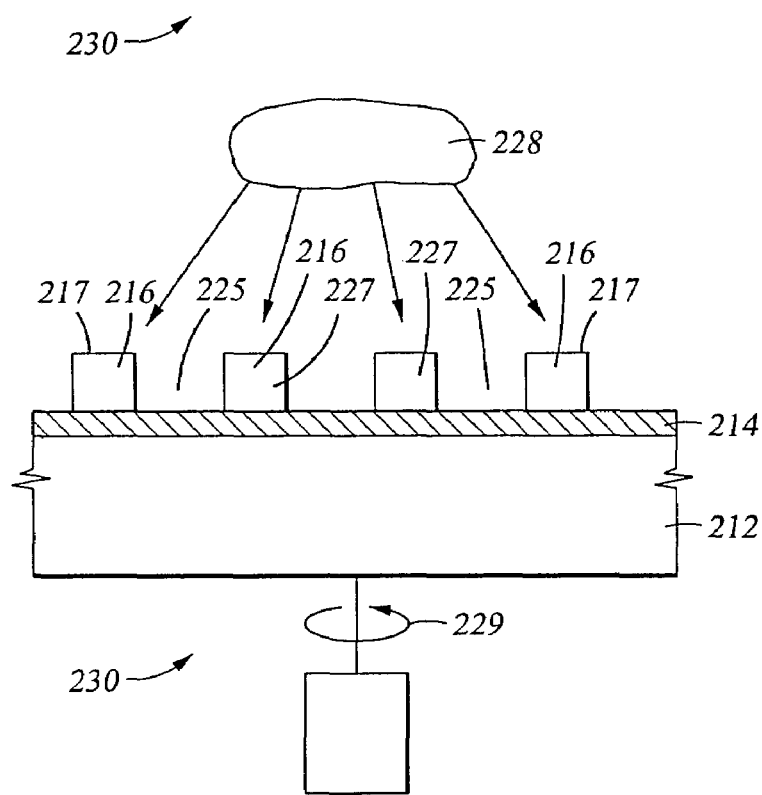

As illustrated in FIG. 2D, the image 224 in CAR 216 is developed subsequent to the PEB (and optionally, subsequent to topcoat 222 removal, as described above). The structure 230 is typically exposed to a liquid developing agent 228, which is generally applied over the upper surface 217 of the CAR 216, while structure 230 is spun 229 about an axis. The spinning of structure 230 helps distribute the developing agent 228 over the entire substrate 230 surface and assists in carrying away dissolved CAR material which is removed in the pattern developing process. The radiation-exposed image 224 is removed to produce open spaces 225, leaving non-irradiated areas 227 in place.

After development of CAR 216 into a pattern, the patterned photoresist is trimmed to remove residual resist scum on open areas and to remove imperfections from the resist surface. This trimming step is not shown in the Figures, but is routinely carried out using a plasma dry etch process. The trim process is described in detail in U.S. patent application Ser. No. 09/811,186 of Buxbaum et al., filed Mar. 16, 2001, assigned to the assignee of the present invention, and hereby incorporated by reference in its entirety.

Figure 2E:
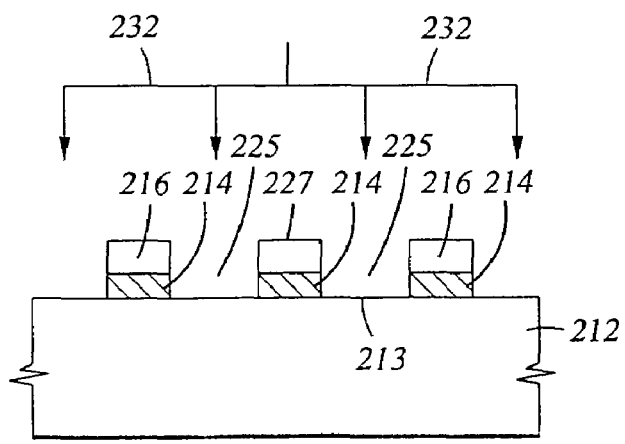

FIG. 2E shows the pattern transfer from CAR 216 into underlying chrome-containing layer 214. Typically this pattern transfer is carried out using an anisotropic plasma dry etching technique. In FIG. 2E, the plasma etchant 232 is shown transferring the pattern from CAR 216 through chrome-containing layer 214 to the upper surface 213 of fused silica substrate 212.

Figure 4:
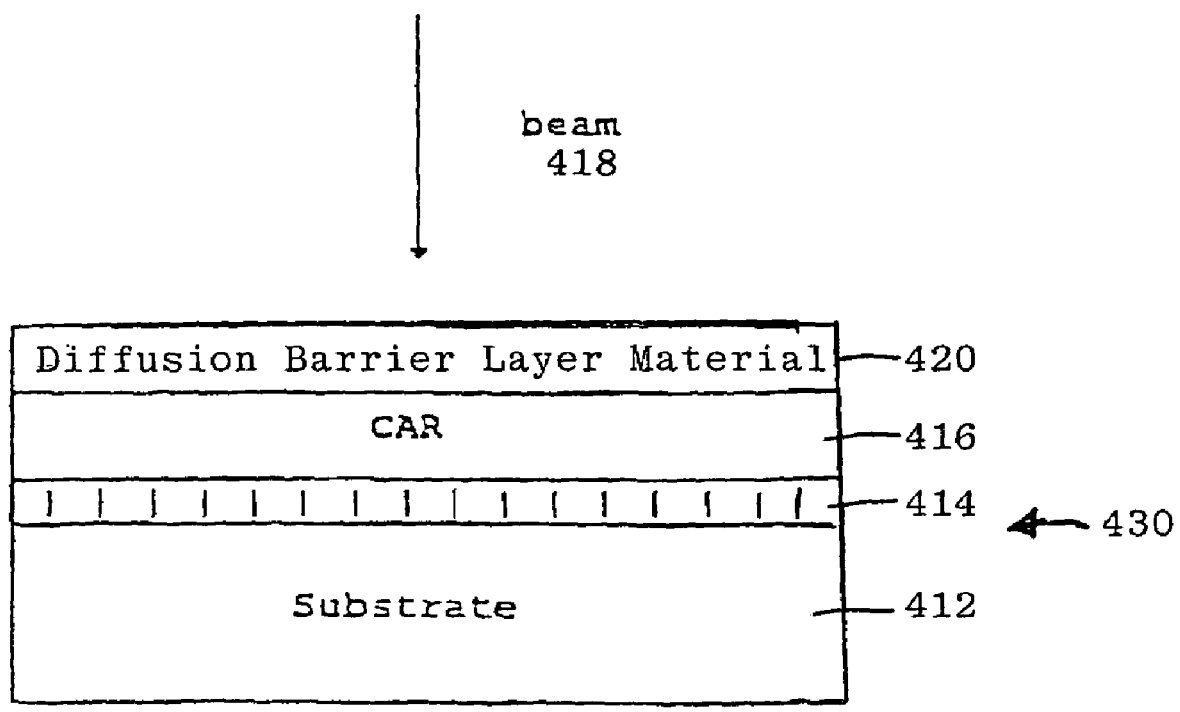
FIG. 4 shows a mask blank with applied layers of CAR and protective barrier layer coating being exposed to a beam of exposing radiation, in accordance with an embodiment of the present invention.

FIG. 4 illustrates another embodiment of the invention, in which a layer of protective barrier material is applied over a CAR layer. FIG. 4 shows a conventional substrate 412 which, for instance, is the quartz or glass substrate (blank) used for making masks, on which is conventionally a thin layer of metal such as chromium 414, which is the mask layer to be patterned. Overlying these is the CAR photoresist layer 416 applied to a conventional thickness, dependent on factors such as the CAR formulation and exposure technique.

The portions of structure 430 which make up layers 412,414, and 416 maybe of the kinds known in the art. An additional protective diffusion barrier layer 420 has been applied over the CAR photoresist layer 416. Diffusion barrier layer 420 is applied subsequent to application and post application bake (PAB) of the CAR layer 416 but while the CAR layer 416 is fresh (before it is subject to environmental contamination). Then, later, structure 430 is exposed to actinic radiation, for instance light, in a conventional lithographic machine. In any case, the CAR is a formulation selected to be sensitive to the particular exposing radiation. Note that, while a beam of exposing radiation is depicted here, representative of direct writing on a photomask, this is not required. In the case of fabrication of a semiconductor wafer rather than a photomask, pattern imaging may be carried out using blanket radiation exposure through a mask.

The protective layer is transmissive of the exposing radiation. The protective diffusion barrier overcoat material is chosen so that it is transmissive to the wavelength of exposure, such as 257 nm, 248 nm, or 193 nm deep ultraviolet light.

Also, the presence of the protective diffusion barrier layer 420 improves the shelf life of the underlying CAR layer by shielding the CAR layer from environmental contaminants (including air and moisture). The coating layer 420, of course, in any case is transmissive to the incident radiation.

The following describes fabrication of the structure 430 of FIG. 4 and its use. The formation of chromium layer 414 on substrate 412 is by a conventional technique, as is the subsequent deposition of the CAR layer 416. After post application soft bake of the freshly prepared CAR layer 416, a thin coating of a protective diffusion barrier layer material 420 is applied. A typical example of a method of application of diffusion barrier layer material 420 is by spin coating a thin (800 Å to 2000 Å) layer of a liquid organic material (water-soluble polymer). The diffusion barrier layer material is selected to have no chemical effect on the soft baked photoresist CAR 416.

A preferred diffusion barrier layer material is one which is water-soluble, so that it can be removed (after exposure of the resist) by rinsing in distilled water.

Structure 430 is conventionally exposed to patterning radiation using actinic light illustrated as a beam 418 in FIG. 4. Suitable systems for exposing the structure 430 include the MEBES and ALTA series systems, available from ETEC Systems, Inc., Hayward, Calif. A subsequent post exposure bake (for complete imaging using the CAR) is also conventional. The post exposure bake may be earned out prior to or after removal of the protective diffusion barrier layer 420, depending on the diffusion baffler layer material used. The protective diffusion barrier layer 410 may be stripped e.g., by rinsing in deionized water, which may remove an organic diffusion barrier layer material.

The protective diffusion barrier layer 420 maybe removed after the exposure to patterning radiation and before post exposure bake, to facilitate easier removal of the protective layer 420. The protective diffusion barrier layer 420 may be left on during the baking process to provide additional environmental protection during the baking process. After the post exposure bake, the CAR layer is developed using conventional processing with a developer technique which is suitable for the particular CAR formulation. Finally, after development of the pattern in the photoresist, the metal film 414 is patterned using a technique such as plasma etching, typically reactive ion etching.

The protective diffusion barrier layer coating is embodied as a non-charge dissipative layer and, in particular, any material suitable for use as a diffusion barrier (i.e., to prevent diffusion of airborne contaminants), for example, in direct write laser mask fabrication application. An example of such as material is AZ Aquatar III, available from Clariant Corporation. Use of such a material provides improvements in eliminating standing waves, protection of the resist from airborne contamination, and elimination of sensitivity to variations in substrate stoichiometry. In one embodiment, improved CD (critical feature) uniformity is achieved through selection of the material having an index of refraction matched to the index of refraction of the resist. For example, the index of refraction of the layer may be approximately equal to the square root of the index for the resist. In such an embodiment, light reflected off the substrate bottom and then internally back off the top of the protective layer and the top of the resist layer is generally equal in intensity.

Fabrication of the structure 430 shown in FIG. 4 maybe as follows. The substrate 412 has applied to it a metal layer 414. The substrate 412 may conventionally be fused silica. The metal layer 414 is the material in which the pattern is eventually formed. Typically, the metal layer is chromium and typically has a thickness of about 600 Å to 1000 Å. The chromium maybe deposited by sputtering.

The photoresist 416, a chemically amplified resist, is applied. The photoresist 416 may have a thickness of about 2500 Å to about 5000 Å, and may be applied by spin coating. A suitable resist 416 is the DX1100 resist, available from Clariant Corporation. The photoresist is soft-baked; this is generally referred to as a "post apply bake (PAB)". The post apply bake removes solvents remaining in the resist film and has been determined to affect the shelf life of the photoresist. The protective diffusion barrier layer 420 is applied over the photoresist 416. For instance, a layer about 450 Å thick may be applied by spin coating at about 1550 RPM and spinning dry in air. As noted above, the coating 522 may be any material suitable for use as a diffusion barrier and, in particular, one such material is the material sold under the trade name AZ Aquatar m by Clariant Corporation. The diffusion barrier layer 420 affords contaminant protection which eventually affects critical dimension (CD) uniformity.

As previously discussed, the patterning of the structure 430 shown in FIG. 4 may occur some time after fabrication of structure 430. The patterning may be carried out using, for example, an ALTA laser writing system, available form ETEC Systems, Inc.

I. Apparatus Used to Image the Car in the Exemplary Embodiments

The imaging system used to practice the method subsequently described herein is a new apparatus, a direct write continuous wave laser tool which may be used for 244 nm or a 257 nm photomask writing. This tool is available from ETEC Systems Inc., Hillsboro, Oreg. This direct write continuous wave laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm (enabling the user to realize features at 50% of specification, or 200 nm). The 257 nm ALTA™ mask writing laser tool provides the user with advanced feature critical dimension (CD) control, linearity, and uniformity. However, realization of the complete performance potential in the fabricated mask depends on the use of appropriate process materials and processing methods during fabrication of the mask. The maximum DUV output power is approximately 1.5 W. The laser is operated at lower power levels to protect optical coatings and extend the life of the laser. Information regarding the optical architecture of the ALTA™ 257 nm direct write continuous wave laser may be obtained from the manufacturer.

An alternative imaging system, which is not described in detail herein, which may be used for e-beam direct writing is the MEBES™ system available from ETEC Systems of Hayward, Calif.

II. Method of Patterning a Photomask Using a Car in Combination with a Protective Topcoat All methods of patterning a photomask may benefit from application of the present method. The method described in the examples below is for a topcoat used during optical patterning of a photomask when a chemically amplified DUV photoresist is used to transfer the pattern to the photomask. The protective topcoat, which acts as a diffusion layer to prevent harmful ambient components from affecting the chemically amplified photoresist, was a neutralized form of a top ARC (a TARC) in the examples below. In particular, the protective topcoat was AZ AQUATAR III™, sold by Clariant Corporation of Somerville, N.J. AQUATAR III™ includes a fluoroalkylsulfonic acid which is present at a concentration of less than 1% by weight, a fluoroalkylsulfonic acid salt which is present at a concentration of less than 5% by weight, and water present at a concentration of greater than 95% by weight. The chemically amplified DUV photoresist (CAR) described in the examples was an acrylic-based chemically amplified photoresist. However, the scope of the invention is not intended to be limited to this particular kind of protective topcoat or this particular family of chemically amplified photoresists.

When the method is applied for an e-beam imaging system, the protective topcoat material may be charge dissipating. A charge dissipating topcoat may be any suitable conductive material which can be readily applied, for instance, a thin layer of an initially liquid organic conductive material (which dries) such as polyaniline. Charge dissipating coatings which are generally known include PANAQUAS™ available from IBM Corporation of Purchase, N.Y., or AQUASAVE™ available from Nitto Chemicals of Osaka, Japan. The exposing electron beam typically is operated at greater than 10,000 volts accelerating voltage and therefore can have a penetration range (through the coating material) on the order of about one micron to several microns below the resist surface. This ability to penetrate the protective topcoat makes it possible to use thin metal layers such as chromium or aluminum as the protective coating, where this would not be possible for direct write optical imaging.

As noted above, any suitable material (charge dissipative or non-charge dissipative) which may be effective as a diffusion barrier (i.e., which may prevent diffusion of contaminants) may be employed as the protective topcoat.

EXAMPLES

Example One

With reference to FIG. 2A, the substrate material 212, chrome-containing layer 214, and CAR layer 216 may be materials conventionally known in the art. For example, the CAR may be a positive tone photoresist such as APEX™, UVIIHS™, Rjv5™, and UV6™ manufactured by Shipley Co., Inc.; AZ DX1000P™, DX1200P™, and DX1300P™ manufactured by Clariant Corporation; ARCH8010™, and ARCH 8030™ manufactured by Arch Chemicals; ODUR-1010™ and ODtJR-1013™ manufactured by Tokyo Ohka Kogyo Co., Ltd.; and PRK 110A5™ manufactured by Sumitomo Chemicals, Inc. Examples of negative tone CARs are SAL-601™, and SAL-603 manufactured by Shipley Co., Inc.; EN-009PG™ manufactured by Tokyo Ohka Kogyo Co., Ltd., and NEB 22™ manufactured by Sumitomo Chemicals, Inc.

The topcoat material 222 applied over the CAR layer 216 may be a conventional material such as AQUATAR II™, AQUATAR III™, AQUATAR IV™, manufactured by Clariant Corporation, and NFC 540™ and NFC 620™ manufactured by JSR Chemical Co. of Japan, also located in San Jose, Calif. These particular topcoat materials also function as ARCs.

Applicants discovered that the topcoat material pH needs to be as neutral as possible to provide stability during the direct write process for imaging of the CAR. In addition, use of a more neutral topcoat provides increased storage life for a CAR coated substrate prior to exposure to imaging radiation. The pH should be adjusted to be within a pH ranging from about 5 to about 8 if the topcoat is to be charge dissipating. If charge dissipation is not necessary, the pH of the topcoat may be adjusted to be within a pH ranging from about 5 to about 8, but is more typically adjusted to be within a range of about 6.5 to about 7.5.

The present example provides a comparison of stability of the topcoated CAR 216 as a function of the pH of the topcoat material 222. The control sample structure 230, as shown in FIG. 2A included, from top to bottom, a layer of topcoat material, AQUATAR III™, which exhibits a pH of about 1.9 to about 2.2 in liquid form, and exhibits a refractive index of about 1.40 in a coated and dried layer about 450 Å thick. When the index of refraction of the topcoat material layer is approximately equal to the square root of the refractive index of the photoresist, this provides a structure in which light reflected off the substrate bottom and then internally back off the top of the protective layer and the top of the resist layer is generally equal in intensity. The AQUATAR III™ was applied by spin coating at about 1550 RPM to a condition of spin dry in air, to produce a layer having a thickness of about 450 Å. Other materials which are capable of acting as a diffusion barrier against harmful ambient conditions, which provide a layer having the proper refractive index may be used as well. When the topcoat 222 material acts as a TARC (as in the case of AQUATAR III™), not only does the topcoat 222 afford contaminant protection and critical dimension (CD) uniformity, but standing wave problems are reduced as well.

Underlying the AQUATAR III™ topcoat layer 222 was a layer of a DX1100™, photoresist (CAR) 216. In particular, the chemically amplified DUV photoresist, DX1100, comprises propylene glycol monomethyl ether acetate (PGMEA); PMA; 1-methoxy-2-propyl acetate; modified phenolic polymer; and an onium salt metal halide complex as a chemical amplifier. This photoresist exhibits a pH of about 6.0 in liquid form, prior to application, and exhibits a refractive index of about 1.818 in a coated and dried layer about 5,000 Å thick. The DX1100™ photoresist was applied via spin coating to produce a spin dry layer having a thickness of about 5,000 Å. The DX1100™ photoresist was then baked in an APT™ bake station, manufactured by APT™ of Santa Clara, Calif., at a temperature of about 90° C. for a time period of about 7 minutes, exposed to atmospheric pressure and ambient conditions, resulting in a decrease in thickness of about 10%. to produce a dry DX1100™ photoresist layer thickness of about 4,500 Å.

Underlying the DX1100™ photoresist (CAR) layer 216 was a 470 Å thick layer of an organic ARC identified as KRF 17G (available from AZ/Clariant) (not shown); a 250 Å thick layer of chromium oxynitride in organic ARC (not shown); a 750 Å thick layer 214 of a metal mask material, typically the metal mask layer is chromium deposited to produce a thickness of about 600 to 1000 angstroms (the chromium may be deposited by sputtering); and a silicon oxide containing substrate 212.

The invention embodiment sample structure was generally the same as described above, however, with respect to the top coat material, this material was pH adjusted prior to application. In particular, the AQUATAR III™ topcoat was pH adjusted to about 7 using tetramethyl ammonium hydroxide, prior to application over the DX1100™ photoresist layer. The refractive index of the neutralized AQUATAR III™ was about 1.4 when measured in a dried layer about 450 Å thick. The base used to adjust the pH of the AQUATAR III™ could be any one of a number of organic or inorganic bases known in the art, selected in consideration of the refractive index of the AQUATAR III™ after pH adjustment.

Both the control sample and the invention embodiment sample were prepared by applying the AQUATAR III™ topcoat material 222 to a thickness of about 450 Å over the surface of a DX1100™ photoresist layer 216 which was about 4975 Å thick. The AQUATAR III™ topcoat material 222 was applied to a spin dry condition in each instance.

The stability of the topcoated CAR was then evaluated by permitting both the control sample and the invention embodiment sample to stand at about 22° C. under fabrication plant air conditions, for a given period of time, followed by removal of the AQUATAR III™ topcoat. The thickness loss in the underlying CAR photoresist upon removal of the protective topcoat was then measured. A decrease in CAR photoresist thickness loss was an indication that the topcoat had protected the CAR photoresist during the standing/storage period. The topcoat was removed using a ten second deionized water rinse. The deionized water was applied using the spin application technique described subsequently herein, with reference to development of the CAR photoresist.

Figure 3:
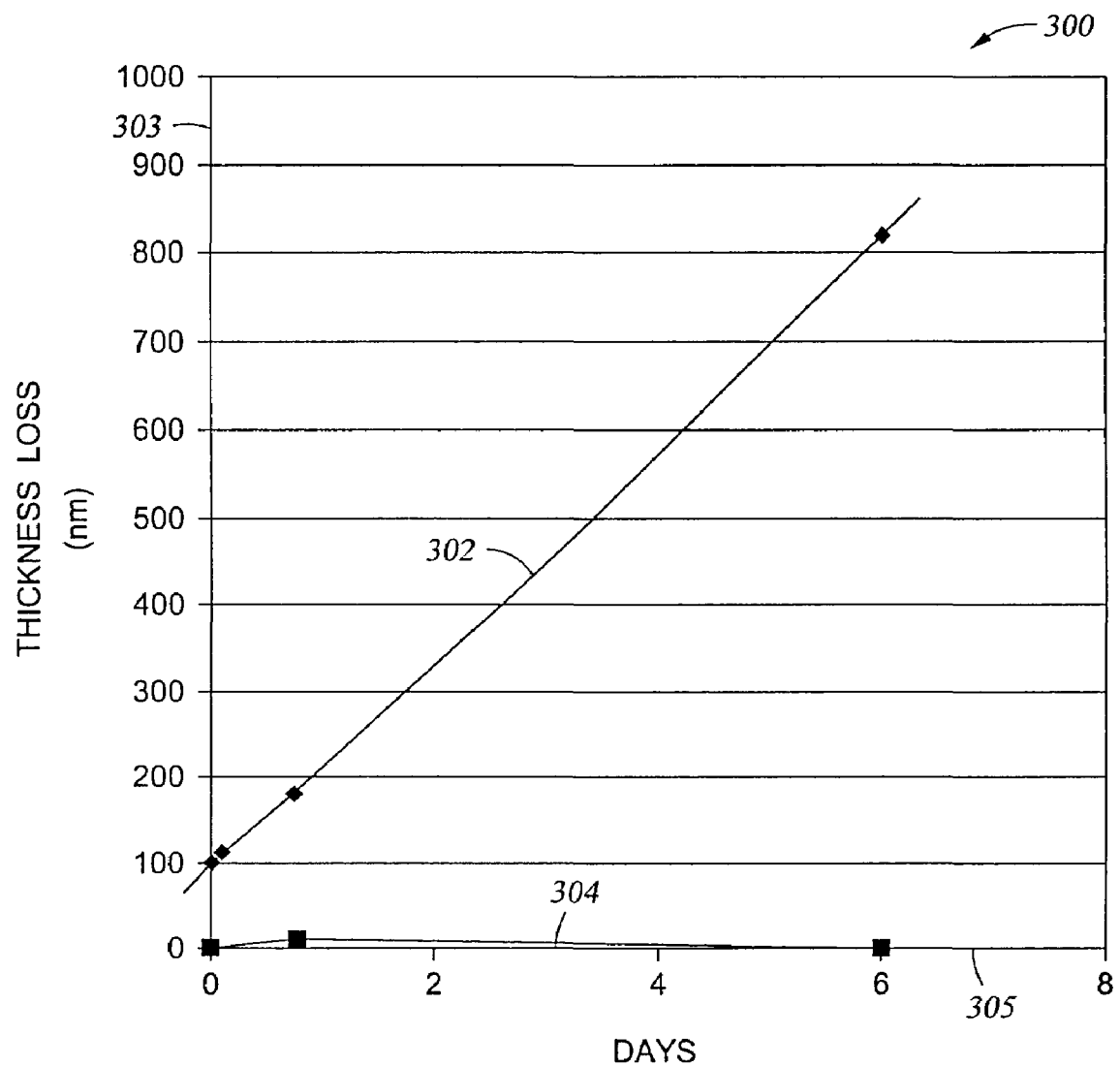
FIG. 3 is a graph 300 which shows CAR thickness loss, in nm, upon development of the CAR, as a function of the number of days of storage of a CAR coated substrate under general ambient conditions, where the room temperature is about 20° C. to about 25° C., and the relative humidity ranges from about 40 to about 45%. Curve 302 represents an unprotected CAR coated substrate. Curve 304 represents a topcoat-protected CAR where the topcoat was neutralized to a pH of about 7.

FIG. 3 shows the thickness loss of the DX1100™ CAR photoresist upon removal of the AQUATAR III™ topcoat as a function of the number of days after application of the AQUATAR III™ topcoat. As described above, the loss in thickness of the DX1100™ CAR photoresist layer during removal of the AQUATAR III™ topcoat is an indication of the stability of the combination of DX1100™ CAR photoresist with the AQUATAR III™ topcoat. If the DX1100™ CAR photoresist thickness decreases to any substantial extent, this is an indication that the AQUATAR III™ topcoat is reacting with the DX1100™ CAR photoresist in a manner which reduces the effectiveness of the photoresist. As illustrated in FIG. 3, Curve 302 represents the control sample in which the pH of the AQUATAR III™ topcoat was not adjusted; while Curve 304 represents the invention embodiment sample in which the pH of the AQUATAR III™ topcoat was adjusted to about 7.0 prior to application. Axis 303 in FIG. 3 indicates the thickness loss of the DX1100™ CAR photoresist layer in nm, while Axis 305 shows the time period in days between application of the DX1100™ CAR photoresist and removal of the topcoat from the DX1100™ CAR photoresist layer surface. It is readily apparent that neutralization of the AQUATAR III™ topcoat material prior to application provides a much more stable system for photomask direct writing, since a long time period, typically about 20 hours, is required for direct writing. In addition, the stability of the pH adjusted topcoat material with the CAR photoresist material permits longer storage of a CAR photoresist coated substrate, enabling longer storage between application of the AQUATAR III™ topcoat material and development of the DX1100™ CAR photoresist, for example.

Example Two

With reference to FIG. 2A again, the stability of the combination of the CAR 216 with the topcoat 222 is critically important in obtaining a uniform critical dimension for the direct write pattern across the entire surface of the substrate being patterned. In the present instance, an ALTA™ 257 nm direct write laser was used for writing of a pattern of lines 225 and spaces 227, where the lines 225 were 0.35µ in width and the spaces 227 between the lines were 0.35µ in width. After direct write imaging radiation 223 was applied to create an image 224 in CAR 216, the substrate 230 was baked as illustrated in FIG. 2B, to promote formation of a complete image 224 using application of a heat (which is illustrated by heat source 226, for example and not by way of limitation).

With reference to FIG. 2C, the neutral pH topcoat 222 has been removed to permit development of the underlying acidic imaged CAR 216. In some instances, where the topcoat 222 is removed by the developer for the CAR 216, this step may not be needed. The AQUATAR III™ topcoat material was removed by rinsing with deionized water for 10 seconds, and subsequently, the DX1100™ CAR photoresist layer was developed using a spin 229/spray 228 process with an AZ 300 MIF developer as illustrated in FIG. 2D. This developer is a 2.38 wt % solution of tetramethyl ammonium hydroxide (TMAH). The development time was about 60 seconds. A low spin speed, approximately 100 rpm, is optimal for initial wetting on the substrate surface, while still permitting uniform agitation due to the rotation of the plate through the nozzle path. The rotation was maintained during developer dispense and then reduced to approximately 15 rpm. Prior to rinsing with $CO_2$-sparged, deionized water, the remaining developer should be spun-off at approximately 1000 rpm for 5 seconds.

After development of the DX1100™ CAR photoresist layer, a dry etch was carried out to transfer the lines 225 and the spaces 227 through the organic ARC and inorganic ARC layers which are not shown, and into the underlying chrome layer 214.

The substrate 230 was etched in a high density plasma under conditions that reduced mean-to-target deviation, while still maintaining good CD uniformity. The plasma etch was performed in an inductively coupled plasma (ICP) etch tool using a three step process: descum/organic ARC (BARC) removal; chrome oxynitride (inorganic ARC)/ chrome etch; and overetch.

Plasma etch systems such as the Applied Materials, Inc. TETRA® DPS™ Plus etch system (available from Applied Materials, Inc., of Santa Clara, Calif.) may be used to provide excellent results. A plasma processing system which permits separate power application for plasma generation and for substrate biasing is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

A description of an apparatus including a Decoupled Plasma Source (DPS) is provided by Yan Ye et al. from the Proceedings of the Eleventh International Symposium of Plasma Processing (May 7, 1996), which was published in the Electrochemical Society Proceedings (Volume 96-12, pp. 222–233, 1996), which is hereby incorporated by reference. U.S. Pat. No. 5,753,044, issued to Hanawa et al. on May 19, 1998, contains a general description of an RF plasma reactor of the kind which permits separate power application and control for plasma generation and maintenance and for substrate biasing, by way of example and not by way of limitation.

The descum/organic ARC (BARC) removal step of the three step etch process removes any residual CAR photoresist layer 216 remaining on open areas after development, and removes the organic ARC (BARC) layer (not shown) from the open areas. This is accomplished using an oxygen plasma. The oxygen plasma is created using oxygen gas as a plasma source gas, and by powering only the lower electrode (upon which the reticle plate rests). This creates both a capacitively coupled plasma and a DC bias between the plasma and the reticle. The DC bias accelerates oxygen ions-from the plasma toward the photomask surface, so that the ions impinge upon the photomask surface with high kinetic energy and directionality, normal to the photomask surface. Typically the process is carried out in a process chamber at a pressure of about 3 mTorr to about 45 mTorr. In the example experiments conducted, the process chamber pressure was about 28 mTorr, and the plasma source gas of oxygen was fed into the processing chamber at a flow rate of about 90 sccm. RF power of about 125 W at a frequency of 13.56 MHZ was applied to the lower electrode (cathode). This provided a DC bias on the photomask substrate surface, while providing an oxygen plasma over the photomask surface. The temperature of the reticle plate was in the range of 25° C., with a chamber wall temperature in the range of 70° C. The descum/organic ARC (BARC) removal time was about 30 seconds. The photoresist loss due to the descum/ organic ARC (BARC) removal process is about 750 Å.

The chrome oxynitride (inorganic ARC) (not shown)/ chrome mask layer 216 etch was done using a plasma generated from a chlorine-oxygen-helium gas mixture. The molecular ratio of the chlorine:oxygen:helium gas mixture was about 33:117:10. The total gas flow rate was about 160 sccm. The ICP coil was powered to about 500 W at 2 MHZ to generate a high density plasma. The lower electrode was powered to about 5 W at about 13.56 MHZ, to generate a DC voltage of about −50 V on the substrate. The temperature of the reticle plate was about 25° C., while the wall temperature of the process chamber was about 70° C. The etch end point was detected by optical emission, and occurred in about 100 seconds. Typically, higher oxygen concentrations and lower pressures cause higher mean-to-target deviation and lower selectivities, while favoring better CD uniformity. One skilled in the art can optimize the process for his/her particular apparatus.

Typically the chrome layer is overetched beyond endpoint to clear residual chrome from all open regions. Generally the overetch step is an extension of the chrome etch process described above. Longer overetch steps result in higher mean-to-target deviations. Chrome spot defect densities can be affected by the length of overetch, with lower defect densities for longer overetch processes.

After completion of the chrome layer etch, a strip and clean process is performed to remove any residual contaminants from the surface of the chrome layer. The strip chemical used was sulfuric peroxide which was heated to about 75° C. and applied over the surface of the substrate plate. After treatment with sulfuric peroxide, the substrate plate is rinsed with $CO_2$-reionized, or $CO_2$-sparged deionized water. After strip, the substrate plate was subjected to an acid clean using an industry standard 70:30 $H_2SO_4/H_2O_2$ solution, followed by another deionized water rinse. The strip step was performed on a Steag ASC 500 wet chemical processing station available from STEAG-HAMMATECH®, Santa Clara, Calif.

When a photomask was fabricated using the mask fabrication method described above, with the control sample topcoat of AQUATAR III™ (not adjusted for pH) over a DX1100™ CAR photoresist, a decrease in critical dimension was incurred in the feature as the writing progressed. For a photomask having 200 nm (2,000 Å) critical dimension feature, the critical dimension decreased by about 250 Å during the writing process. When a photomask was fabricated using the method of the invention, with a pH adjusted topcoat of AQUATAR III™ over a DX1100™ CAR photoresist, there was less than a 25 Å decrease in the critical dimension of the feature during the writing process.

The above described exemplary embodiments are not intended to limit the scope of the present invention, as one skilled in the art can, in view of the present disclosure, expand such embodiments to correspond with the subject matter of the invention claimed below.

We claim:

1. A method of increasing a shelf life of a photomask substrate coated with photoresist prior to direct writing of a photomask pattern onto said photoresist, comprising:

forming a layer of a chemically amplified photoresist over a principal surface of said photomask substrate;

post-apply baking said photoresist; and forming a non-conductive, DUV transmissive, environmental barrier laye, wherein the pH of the barrier layer material ran es between about 5 to about 8, over said photoresist layer before said photoresist layer is subject to environmental contamination which affects lithographic properties of s photoresist layer, to provide a coated photomask substrate having a shelf life of one week or greater.

2. The method of claim 1, wherein said photomask substrate comprises a layer of metal overlying a substrate selected from the group consisting of quartz or glass.

3. The method of claim 2, wherein said metal is chromium.

4. The method of claim 1, wherein said photoresist layer is applied to have a thickness within the range of about 2500 Å to about 5000 Å.

5. The method of claim 1, wherein said barrier layer comprises an organic material.

6. The method of claim 1, wherein said barrier layer material is selected so that is transmissive to a wavelength of light within the range of about 193 nm to about 257 nm.

7. The method of claim 6, wherein said barrier layer material acts as a barrier against diffusion of airborne contaminants.

8. The method of claim 7, wherein said barrier layer material is selected to have an index refraction related to an index of refraction of said photoresist.

9. The method of claim 8, wherein said index of refraction of said barrier layer is approximately equal to the square root of said index of refraction of said photoresist.

10. The method of claim 8, wherein said coated photomask substrate enables increased critical dimension uniformity after imaging of said photoresist and patterning of said substrate.

11. The method of claim 1, wherein said barrier layer is formed by spin coating said layer and spinning dry in air.

12. The method of claim 1, wherein said barrier layer is applied to have a thickness ranging from about 450 Å to about 2000 Å.

13. The method of claim 1, wherein said shelf life of said coated photomask substrate ranges from one week to at least 4 months.

14. A method of fabricating a photomask, comprising:
forming a layer of a chemically amplified photoresist over a principal surface of a photomask substrate;
post-apply baking said photoresist;
forming a non-conductive, DUV transmissive, environmental barrier layer, wherein the pH of the barrier layer material ranges between about 5 to about 8, over said photoresist layer before said photoresist layer is subject to environmental contamination which affects lithographic properties of said photoresist layer; and
direct writing a photomask pattern upon said photoresist using optical direct write continuous laser radiation, whereby the stability of a photoresist-coated photomask substrate during storage and the stability of the photoresist during direct writing of said pattern are both improved.

15. The method of claim 14, wherein said photomask substrate comprises a layer of metal overlying a substrate selected from the group consisting of quartz or glass.

16. The method of claim 15, wherein said metal is chromium.

17. The method of claim 14, wherein said photoresist layer is applied to have a thickness within the range of about 2500 Å to about 5000 Å.

18. The method of claim 14, wherein said barrier layer comprises an organic material.

19. The method of claim 14, wherein said barrier layer material is selected so that is transmissive to a wavelength of light within the range of about 193 nm to about 257 nm.

20. The method of claim 14, wherein said barrier layer material acts as a barrier against diffusion of airborne contaminants.

21. The method of claim 20, wherein said barrier layer material is selected to have an index refraction related to an index of refraction of said photoresist.

22. The method of claim 21, wherein said index of refraction of said barrier layer is approximately equal to the square root of said index of refraction of said photoresist.

23. The method of claim 22, wherein said coated photomask substrate enables increased critical dimension uniformity after imaging of said photoresist and patterning of said substrate.

24. The method of claim 14, wherein said barrier layer is formed by spin coating said layer and spinning dry in air.

25. The method of claim 14, wherein said barrier layer is applied to have a thickness ranging from about 450 Å to about 2000 Å.

26. The method of claim 14, wherein direct writing of said photomask pattern upon said photoresist is performed using an ALTA optical continuous write laser system.

27. The method of claim 19, wherein direct writing of said photomask pattern upon said substrate is performed using a wavelength of light selected from the group consisting of 244 nm and 257 nm.

28. The method of claim 14, wherein, after direct writing of said photomask pattern upon said photoresist, said method further includes the step of post-exposure baking said photoresist.

29. The method of claim 28, wherein, after post-exposure baking of said photoresist, said method further includes the step of developing said photoresist.

30. The method of claim 29, wherein said method further includes removing said barrier layer.

31. The method of claim 30, wherein said barrier layer is removed simultaneously with development of said photoresist.

32. The method of claim 15, wherein, after direct writing of said photomask pattern upon said photoresist, said method further includes the steps of post-exposure baking said photoresist, followed by developing said photoresist, followed by pattern etching said metal layer.

33. The method of claim 32, wherein said pattern etching of said metal layer is performed using plasma etching or reactive ion etching.

* * * * *